US005498992A

United States Patent [19]

Lai et al.

[11] Patent Number: 5,498,992

[45] Date of Patent: Mar. 12, 1996

[54] UNITY GAIN POSITIVE FEEDBACK INTEGRATOR WITH PROGRAMMABLE CHARGING CURRENTS AND POLARITIES

[75] Inventors: Benny W. H. Lai, San Jose; Richard C. Walker, Palo Alto, both of Calif.

[73] Assignee: Hewlett-Packard Company, Palo Alto, Calif.

[21] Appl. No.: 358,031

[22] Filed: Dec. 14, 1994

Related U.S. Application Data

[63] Continuation of Ser. No. 877,449, Apr. 30, 1992, abandoned.

[51] Int. Cl.[6] .............................. H03K 4/58; H03K 4/56; H03K 4/52

[52] U.S. Cl. .......................... 327/345; 327/199; 327/215; 327/336; 327/341; 327/482; 327/589

[58] Field of Search .................................... 307/273, 289, 307/290, 261, 263, 291, 246, 254; 328/35, 127, 181; 327/131, 170, 185, 199, 215, 336, 337, 341, 345, 482, 589

[56] References Cited

U.S. PATENT DOCUMENTS

| | | | |
|---|---|---|---|
| 3,281,073 | 10/1966 | Chou et al. | 307/593 |
| 3,437,844 | 4/1969 | Chua | 307/289 |
| 4,260,912 | 4/1981 | Bjorke | 307/593 |
| 4,550,295 | 10/1985 | Sasaki | 327/337 |
| 4,734,598 | 3/1988 | Böhme | 328/127 |
| 4,806,880 | 2/1989 | Laws | 327/336 |
| 4,874,966 | 10/1989 | Gehrt et al. | 307/291 |
| 5,079,443 | 1/1992 | Wada et al. | 307/291 |
| 5,081,423 | 1/1992 | Koyama et al. | 328/127 |
| 5,144,645 | 9/1992 | Schiffmann | 307/273 |
| 5,227,681 | 7/1993 | Koyama et al. | 328/127 |

FOREIGN PATENT DOCUMENTS

| | | | |
|---|---|---|---|
| 0673395 | 11/1966 | Belgium | 307/291 |
| 1361909 | 4/1964 | France | 307/273 |
| 2138351 | 2/1973 | Germany | 307/291 |
| 0121450 | 10/1978 | Japan | 307/291 |
| 0151814 | 11/1980 | Japan | 307/291 |
| 0241219 | 9/1990 | Japan | 307/291 |
| 1202035 | 12/1985 | U.S.S.R. | 307/291 |

OTHER PUBLICATIONS

Williams, "Transistor Choper", Electronics Engineering Edition, May 23, 1958, pp. 64–65.

Stahl, "Dual One-Shot Generates Identical-Width Pulses From Both Edges Of Its Input", Electronic Design 23, Nov. 8, 1978 (vol. 23), p. 134.

*Primary Examiner*—Terry Cunningham

[57] ABSTRACT

An integrator includes a capacitor and a bootstrap circuit for detecting any leaking charge from the capacitor and replacing it. The integrator also includes a charge injection circuit for adjusting the charge applied to the capacitor in response to a digital control input to the charge injection circuit. The bootstrap circuit has two transistors to sense leaking charge, and two further transistors forming a differential pair. The bootstrap circuit uses positive feedback and unity gain to replenish the lost charge.

3 Claims, 4 Drawing Sheets

UNITY GAIN POSITIVE FEEDBACK INTEGRATOR WITH PROGRAMMABLE CHARGING CURRENTS AND POLARITIES

CROSS REFERENCE TO RELATED APPLICATIONS

This is a continuation of application Ser. No. 07/877,449 filed on Apr. 30, 1992, now abandoned.

FIELD OF THE INVENTION

The invention relates to integrators and, more particularly, to low-noise capacitive integrators using unity gain positive feedback with programmable integrating rates.

BACKGROUND OF THE INVENTION

Integrators are electronic devices that produce an output signal equal to the time integral of the input signal. These integrators are characterized by the integration rate, and their ability to remember the signal over time. For capacitive integrators, the charging current and the value of the capacitor determine the integration rate, and the leakage current from the capacitor determines the effectiveness of the integrator's memory.

A capacitive integrator utilizes a storage capacitor to store and maintain charge within the integrator circuit. Traditionally, these capacitive integrators are implemented with capacitive negative feedback using an operational amplifier (op-amp) having a gain approaching infinity. However, due to this requirement of high open-loop gain, the op-amp must be carefully compensated to maintain stability. Such compensation is very difficult, especially for applications requiring high-speed processing. In addition, because of the high gain, the op-amp is more susceptible to picking up unwanted noise.

When a capacitive integrator is used in a phase-lock loop circuit, the capacitor is chosen such that the loop is stable over an operating frequency range. If this range is scaled, then the integrating rate of the integrator must be scaled accordingly. Typical integrators with a constant charging current require the value of the capacitor to be scaled inversely by the same factor to achieve the required charging rate. For a fixed-valued capacitor, it must be physically replaced by substitution. This process is inconvenient, expensive, and time-consuming.

It is desirable, therefore, to provide an inexpensive, relatively simple capacitive integrator which does not require an operational amplifier.

It is also desirable to produce a capacitive integrator which can adjust the charging rate without changing the value of the capacitor.

SUMMARY OF THE INVENTION

The present invention provides a unity gain, positive feedback integrator with programmable charging currents and polarities which provides all or some of the desirable characteristics of an ideal capacitive integrator. To this end, the present invention provides a bootstrap circuit using positive feedback to store and maintain the charge of a storage capacitor of the integrator and provides a programmable charging current circuit coupled to the bootstrap circuit for allowing the charging rate of the capacitor to be variable.

By using positive feedback and unity gain, this invention does not require frequency compensation to maintain stability as do the negative feedback op-amps commonly used. Moreover, due to the programmable charging current circuit, the invention allows the charging current into the storage capacitor to be adjustable. This feature allows the designs of phase-lock loops to operate over a wide frequency range with one storage capacitor.

BRIEF DESCRIPTION OF THE DRAWINGS

The present invention will be better understood, and its advantages will become apparent, by reference to the following detailed description in conjunction with the accompanying drawings in which.

DETAILED DESCRIPTION OF THE INVENTION

Figure 1:
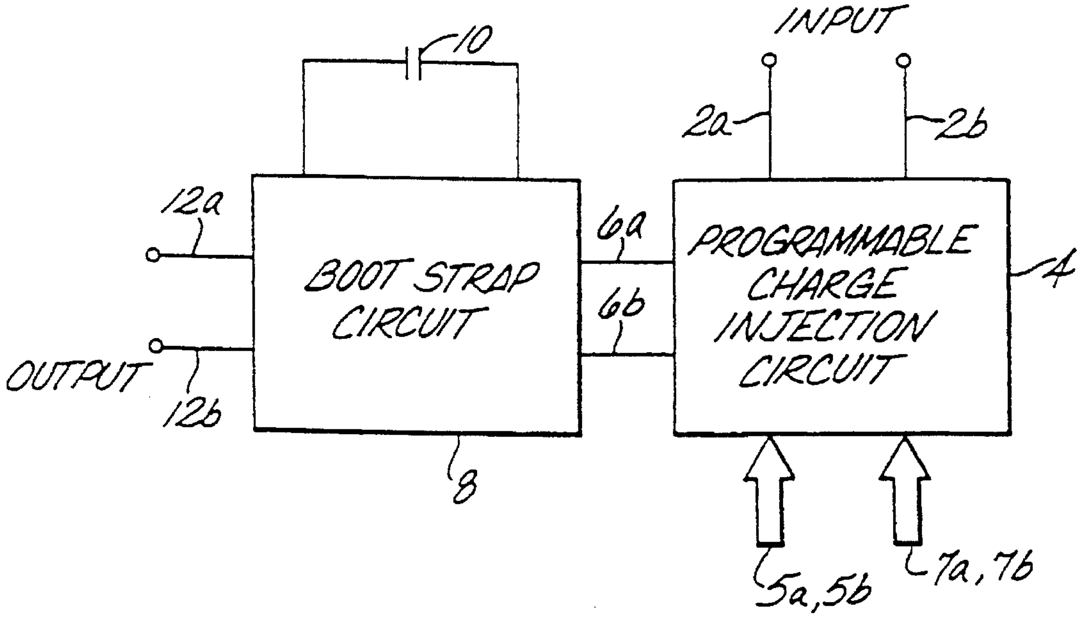
FIG. 1 is a block diagram of the bootstrap circuit and programmable charge injection circuit included within the integrator according to the present invention.

Referring to FIG. 1, an integrator circuit is formed by a charge injection circuit 4, and a bootstrap circuit 8, which includes storage capacitor 10. The input charges to the integrator according to the present invention are first applied at inputs 2*a*, 2*b* of charge injection circuit 4. These input charges are processed by circuit 4 and transferred to circuit 8 at conductors 6*a*, 6*b*. The charges are then stored at capacitor 10.

The charge injection circuit is preferably programmable by applying further inputs at adjust control inputs 5, 7. The output of the charge injection circuit is applied across conductors 6*a*, 6*b* to the bootstrap circuit 8. The output of the integrator occurs at output nodes 12*a*, 12*b* in the form of a voltage signal.

In operation, the programmable charge injection circuit 4 controls the charging rate of the capacitor 10. The bootstrap circuit 8 maintains the charge stored in the capacitor by replacing any charge lost when current leaks from the capacitor. By maintaining charge, the outputs 12*a*, 12*b* will truly represent an integral of the input voltages applied at input 2*a*, 2*b*.

Figure 2:
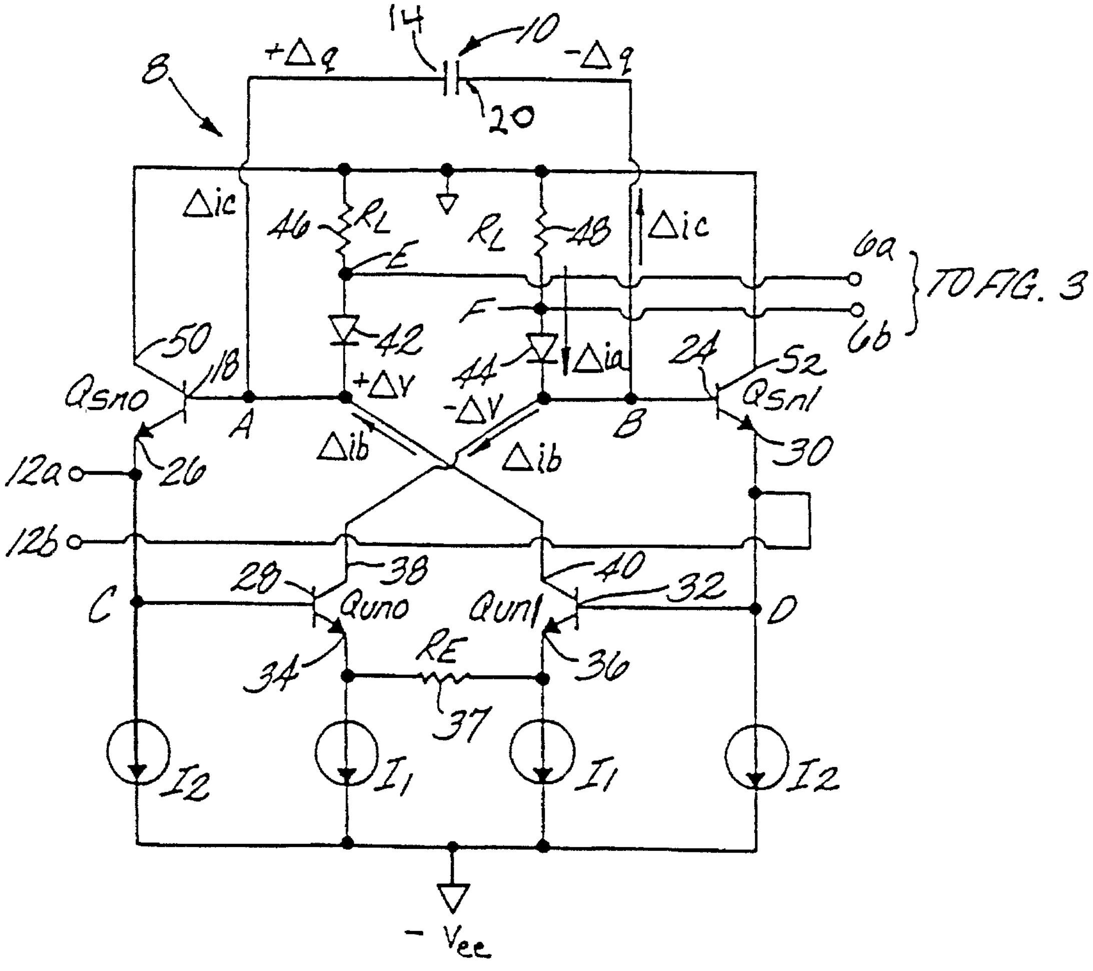
FIG. 2 is a schematic diagram of a preferred embodiment of the bootstrap circuit used in the integrator of FIG. 1.

Referring to FIG. 2, the preferred embodiment of bootstrap circuit 8 according to the present invention includes a capacitor 10 having a first plate 14 and a second plate 20. The first plate 14 connects to node A at the base 18 of a first sensing transistor $Q_{sn0}$. The second plate 20 of the capacitor 10 connects to node B at the base 24 of a second sensing transistor $Q_{sn1}$. Transistor $Q_{sn1}$ is preferably identical to transistor $Q_{sn0}$. The emitter 26 of transistor $Q_{sn0}$ is connected to node C. Node C is connected to the base 28 of a transistor $Q_{un0}$. Similarly, the emitter 30 of transistor $Q_{sn1}$ is connected to node D. Node D is connected to the base 32 of transistor $Q_{un1}$. Transistor $Q_{un1}$ is preferably identical to transistor $Q_{un0}$. The respective emitters 34, 36 of transistors $Q_{un0}$ and $Q_{un1}$ are connected by emitter resistor 37 ($R_E$). This provides a differential pair of transistors.

The emitters of transistors $Q_{un0}$ and $Q_{un1}$ are each coupled to current source I1 which biases the pair of transistors to their operating ranges. Similarly, the emitters of transistors $Q_{sn0}$ and $Q_{sn1}$ are connected to current sources I2. Collector 38 of transistor $Q_{un0}$ is coupled to node B. The collector 40 of transistor $Q_{un1}$ is cross-coupled to node A. A first diode 42 is connected between node A and node E. A second diode 44 is connected between node B and node F. A load resistor 46 is connected to node E. Similarly, a load resistor 48 is connected to node F. The collector 50 of transistor $Q_{sn0}$, the collector 52 of transistor $Q_{sn1}$, and load resistors 46 and 48 are connected to ground. All transistors are preferably NPN-type, but can also be other suitable types, such as PNP.

The operation of the bootstrap circuit of FIG. 2 will now be described. To maintain the charge stored in capacitor 10, the bootstrap circuit 8 detects the leakage current which flows from the capacitor and replaces the amount of charge lost due to this leakage current. For example, assume a charge is put into the capacitor 10 which results in $+\Delta Q$ at plate 14 and $-\Delta Q$ at plate 20. This will result in a voltage represented by $+\Delta V$ at node A and $-\Delta V$ at node B. The $+\Delta V$ voltage at node A will result in a current $\Delta i_a$ (equal to $\Delta V/R_L$) through diode 42, as shown. Similarly, for node B, current $\Delta i_a$ will appear going down through diode 44. These currents are leakage currents, and the charge lost from the capacitor due to these currents must be replaced to maintain the initial charge stored $\Delta Q$ in the capacitor.

To do this, the voltage $+\Delta V$ is sensed by transistor $Q_{sn0}$. This voltage also appears at the base of transistor $Q_{un0}$ at node C. Likewise, $-\Delta V$ is sensed by transistor $Q_{sn1}$ at node B. This negative voltage also appears at the base of transistor $Q_{un1}$ at node D. The $+\Delta V$ voltage at node C results in a current $\Delta i_b$ away from node B, and the $-\Delta V$ voltage at node D results in a $\Delta i_b$ current into node A. If the values of the circuit components are properly set, $\Delta i_b$ can be made equal to $\Delta i_a$, thereby eliminating the net leakage current $\Delta i_c$. In other words, the net leakage current $\Delta i_c$ would normally equal $\Delta i_a$ without using the bootstrap circuit. However, the bootstrap circuit senses $\Delta i_a$ and produces $\Delta i_b$, such that $\Delta i_c = \Delta i_a - \Delta i_b$, and the circuit elements are selected such that $\Delta i_a$ minus $\Delta i_b$ equals zero. Therefore, the leakage current is returned to the capacitor, in effect, so the charge in the capacitor is maintained.

To achieve this cancellation, the voltage gain (Av), from the difference of the voltages at node C and node D to the difference of the voltages at node A and node B, equals 1. In this case, it will be appreciated that the leakage currents will cancel. To ensure this result, the resistance of emitter resistor 37 ($R_E$) is preferably set equal to one-half of the resistance of load resistors $R_L$, thus $R_L = R_E/2$. Note that the bias currents through $Q_{un0}$ and diode 44 are equal, so their transconductances are equal. Likewise, the transconductances of transistor $Q_{un1}$ and diode 42 are also equal. Well known small circuit analysis thus shows that $\Delta i_a = \Delta i_b$, and thus $\Delta i_c = i_a - \Delta i_b = 0$.

The bias current I1 sets the operating point of the differential pair $Q_{un0}$ and $Q_{un1}$. The dynamic range of unity gain, that is, the maximum voltage difference between nodes C and D for the gain to be unity, is determined by I1 and $R_E$. I2 is simply used to bias the sensing transistors $Q_{sn0}$ and $Q_{sn1}$ into their operating ranges.

If the gain is slightly below 1, then there will be slight leakage current from the capacitor. If the gain is slightly above 1, the capacitor voltage will slowly tend toward its maximum storage value. In either case, however, the circuit will not oscillate. In effect, the closer to unity, the longer the charge will remain because the RC time constant will be greater. This is not a concern for most phase-lock loop applications in which the charge to the capacitor is continually updated.

The charge injection to the bootstrap circuit for charging the capacitor is applied at nodes E and F, which are coupled to conductors 6a and 6b, as shown in FIG. 2. The charging current is preferably applied to nodes E and F as shown, although it could be applied directly to the capacitor at nodes A and B.

Figure 3:
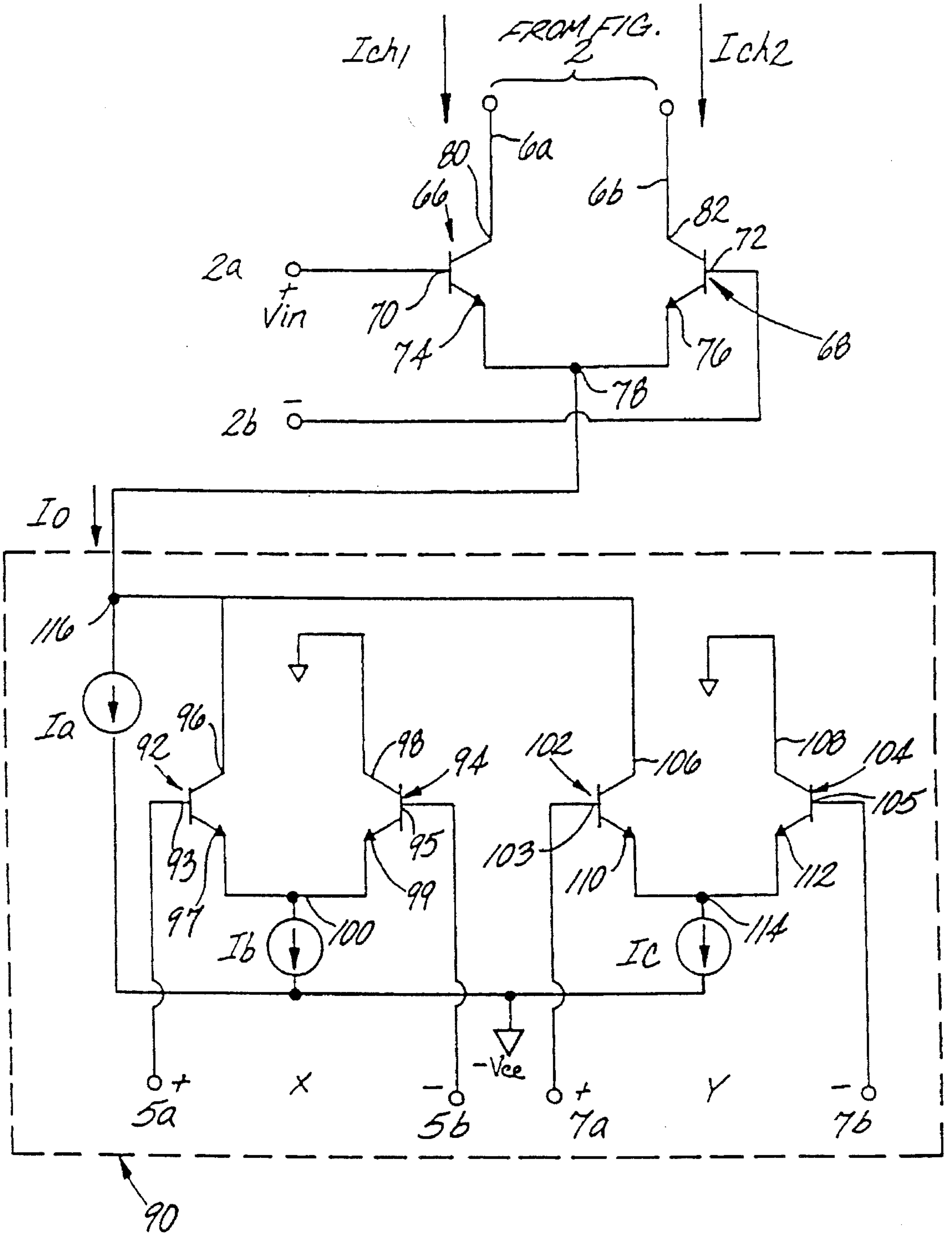
FIG. 3 is a preferred embodiment of the charge injection circuit of FIG. 1.

Referring to FIG. 3, the programmable charge injection circuit according to the present invention allows the integrator circuit to control the integration rate without having to replace the capacitor 10 of the bootstrap circuit shown in FIG. 2. Instead, the charge injection circuit allows scaling of the charging current that is sent to the capacitor. The input to the integrator is applied to differential voltage inputs 2a, 2b, which are coupled to the bases 70, 72 of transistors 66, 68. The emitters 74, 76 of transistors 66, 68 are coupled at node 78 to form a differential pair. The collectors 80, 82 of the transistors provide the charging current at nodes 6a and 6b of FIG. 2 to capacitor 10.

To control the amount of charge that is stored in the capacitor, the gain of the differential pair is altered by varying the bias current applied to node 78 of the differential pair. This bias current is altered by a 2-bit digital adjustment circuit 90 which includes adjustment control inputs 5a, 5b for a first bit of the digital input and adjustable current inputs 7a and 7b for a second bit of the digital input. The digital input at input nodes 5a, 5b is applied to bases 93, 95 of transistors 92 and 94. Collector 96 of transistor 92 provides one component of the biasing current to the differential pair 66, 68. The collector 98 of transistor 94 is coupled to ground. The emitters 97, 99 of transistors 92, 94 are connected together at node 100.

Similarly, inputs 7a, 7b are connected to transistors 102 and 104 at their bases 103, 105. Collector 106 of transistor 102 provides the second component of biasing current to the differential pair 66, 68. Collector 108 of transistor 104 is coupled to ground. Emitters 110 and 112 of the transistors 102 and 104 are coupled together at node 114. Node 100 is biased with a current source $I_b$. Node 114 is biased by a current source $I_c$. The current sources $I_b$ and $I_c$ are both coupled to a third current source $I_a$, which is connected to node 116. The transistors are all preferably NPN.

It will be appreciated that as the digital inputs at digital input adjustments 5 and 7 are changed, a variable amount of biasing current will be applied to the differential pair 66, 68. Thus, by effecting the digital inputs to the digital adjustment circuit 90, the charging current sent to capacitor 10 can be altered.

Figure 4:
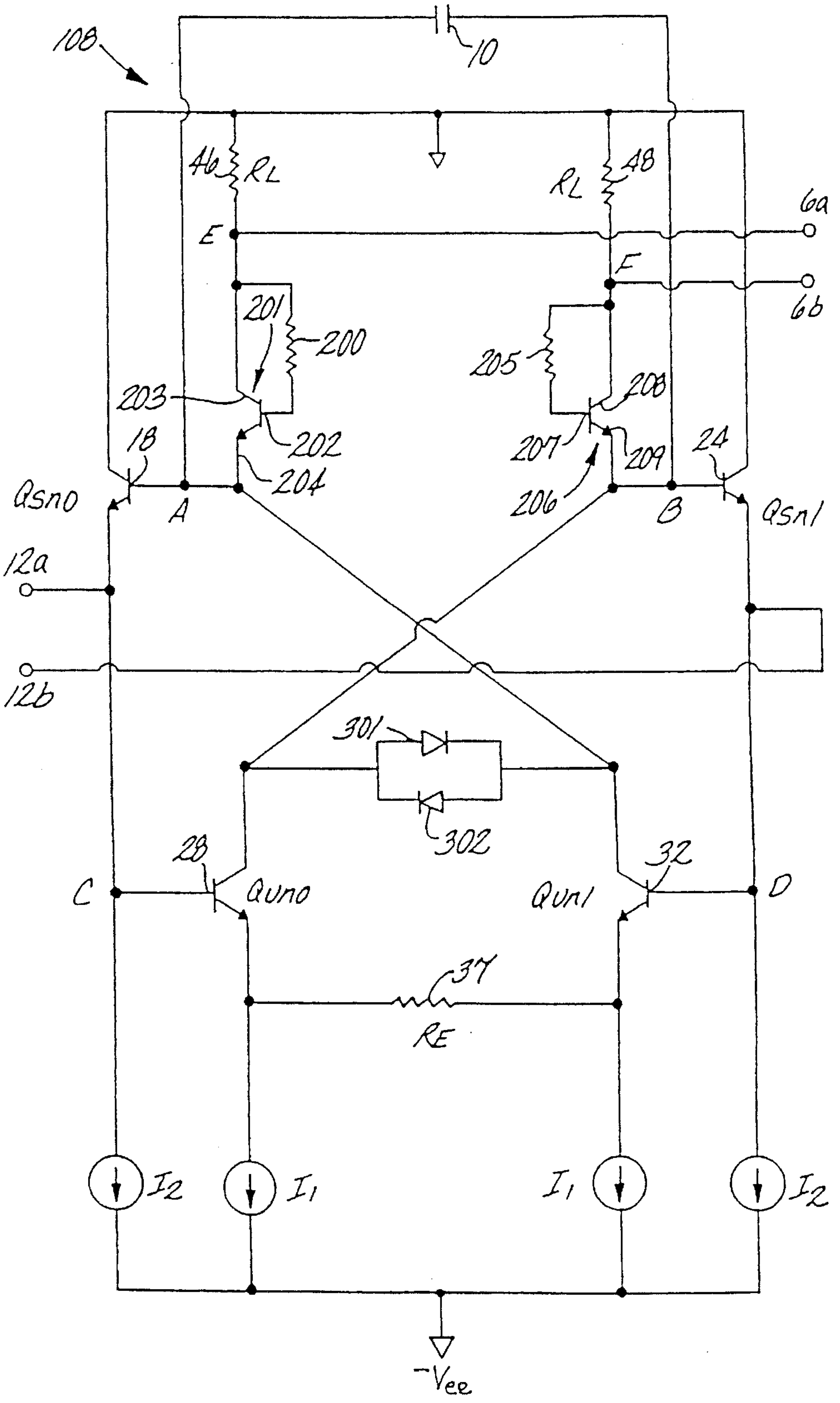
FIG. 4 is an alternative embodiment of the bootstrap circuit of FIG. 2.

A variation of the bootstrap circuit is shown in FIG. 4. This variation is referred to as an enhanced bootstrap circuit 108. In FIG. 4, like reference numbers represent like elements as those in FIG. 2.

The enhancements in FIG. 4 include the substitution of resistors 200, 205 and transistors 201, 206 for diodes 42, 44, respectively. Collectors 203, 208 of transistors 201, 206 are connected to nodes E, F, respectively, and bases 202, 207 are connected through resistors 200, 205 to nodes E, F, respectively. Emitters 204, 209 are connected to nodes A, B, respectively. In addition, a pair of diodes 301, 302 are connected the anode of diode 301 and the cathode of diode 302 coupled to node B and the cathode of diode 301 and the anode of diode 302 coupled to node A, to clamp nodes A, B to a specified voltage level, e.g., 0.8 volts. This helps ensure that differential pair 28, 32 and the circuit always operate at unity gain, provided that I1 is set so that its dynamic range of unity gain is beyond 1.0 volt in this case.

The bootstrap integrator preferably operates where it can maintain unity gain. An analysis of the preferred voltage range is thus provided as follows:

As input voltage to the differential pair increases from 0, the current through resistor 37 increases from I1 to 2I1, because the current through $Q_{un1}$ decreases. Since the base-emitter voltages of $Q_{un0}$ and $Q_{un1}$ are almost the same, while both devices are still on, the input voltage difference is absorbed by resistor 37 ($R_E$). As this voltage approaches $R_E$ times I1, the current to $Q_{un1}$ is passed sufficiently through resistor 37 such that $Q_{un1}$ begins to turn off. Beyond this, the linear relationship of the gain disappears. By symmetry, the full range is $2(R_E)I$. For practical purposes, one should preferably stay within 90% of this range.

It should be noted that transistors 201, 206, 28, and 32 are preferably identical for optimal matching. Resistors 200, 205 are preferably provided, as these resistors allow even better matching of impedance at the base-emitter junctions of transistors 201, 206. Resistors 46, 48, 37, 200, and 205 are preferably built with identical materials and geometries for optimal matching.

It is also noted that the charging currents from the charge injection circuit could be applied directly to the capacitor at nodes A, B. However, if these charging currents have a common-mode dc current component, this dc current will flow through the diodes 42, 44, thereby changing their dc biases, which then changes the unity gain of the bootstrap circuit. Thus, the preferred nodes for charge injection are nodes E, F. Since the impedances of the diodes are small compared to $R_L$, the charging currents will appear at the capacitor.

The integrator according to the invention may be used in various applications, most preferably in the device for clock recovery and data retiming for random NRZ data, as disclosed in U.S. Pat. No. 5,012,494, incorporated by reference herein.

The unity gain positive feedback technique allows an integrator to be implemented with IC technology and one external capacitor. Compared to traditional integrators based on op-amps (negative feedback with infinite gain), this has advantages of not needing compensation for stability. This is especially important in high-speed processes where negative feedback and compensation is very difficult. The reduction in active area is also tremendous.

The addition of the programmable charging currents to the bootstrapped capacitor enables designs of phase-lock loops to work over a very wide range of frequencies with the same capacitor without tradeoffs in stability in the overall loop. In the past, to operate a phase-lock loop at 1/n of the desired frequency, the value of the capacitor would have to be n times larger to maintain the same stability margin for the loop. With the present invention, the charging current to the capacitor could easily be programmed to be n times smaller, thereby maintaining the same capacitor value.

Numerous variations of the invention will be evident to one of ordinary skill; therefore, the scope of the claims is not intended to be limited to the described embodiments.

What is claimed is:

1. An integrator circuit comprising:

a storage capacitor coupled to an input and output for storing charge, the charge on the capacitor representing the time integral of the current flowing from the input through the capacitor to the output; and circuit means connected to the capacitor for detecting leaking charge from the capacitor, thereby maintaining the charge stored in the capacitor, wherein the circuit means comprises means for providing positive feedback in response to the leaking charge, the circuit means further comprising first and second transistors for sensing the leakage charge and having first and second bases, respectively, the first and second bases being connected to opposite sides of the capacitor, the means for providing positive feedback comprising third and fourth transistors having third and fourth bases, respectively, the first and second transistors having first and second emitters and first and second collectors, respectively, and the third and fourth transistors having third and fourth collectors, respectively, the first and second emitters being connected to the third and fourth bases, respectively, the first and second collectors being connected to the first and second bases, respectively, and the third and fourth collectors being cross-connected to the second and first bases, respectively, the circuit means further comprising a first load resistor and a first diode connected between the first collector and base of the first transistor, and a second load resistor and a second diode connected between the second collector and base of the second transistor.

2. An integrator circuit comprising:

a storage capacitor coupled to an input and output for storing charge, the charge on the capacitor representing the time integral of the current flowing from the input through the capacitor to the output; and circuit means connected to the capacitor for detecting leaking charge from the capacitor, thereby maintaining the charge stored in the capacitor, wherein the circuit means comprises means for providing positive feedback in response to the leaking charge, the circuit means further comprising first and second transistors for sensing the leakage charge and having first and second bases, respectively, the first and second bases being connected to opposite sides of the capacitor, the means for providing positive feedback comprising third and fourth transistors having third and fourth bases, respectively, the first and second transistors having first and second emitters and first and second collectors, respectively, and the third and fourth transistors having third and fourth collectors, respectively, the first and second emitters being connected to the third and fourth bases, respectively, the first and second collectors being connected to the first and second bases, respectively, and the third and fourth collectors being cross-connected to the second and first bases, respectively, the circuit means further comprising a first load resistor and a fifth transistor connected between the first collector and base of the first transistor, the fifth transistor having a first emitter connected to the first base of the first transistor, and a fifth base and collector connected together, and a second load resistor and a sixth transistor connected between the second collector and base of the second transistor, the sixth transistor having a sixth emitter connected to the second base of the second transistor, and a sixth base and collector connected together.

3. The integrator circuit of claim 2, wherein the circuit means further comprises a pair of diodes, the diodes each having a cathode and an anode, the cathode of the first diode and the anode of the second diode being coupled to the base of the first transistor and the anode of the first diode and the cathode of the second diode being coupled to the base of the second transistor.

* * * * *